United States Patent
Jang et al.

(10) Patent No.: US 8,143,692 B2
(45) Date of Patent: Mar. 27, 2012

(54) CAPACITANCE TRIMMING CIRCUIT OF SEMICONDUCTOR DEVICE HAVING VERTICALLY STACKED CAPACITOR LAYERS AND OPERATION METHOD THEREOF

(75) Inventors: Myoung-jun Jang, Hwaseong-si (KR); Tae-soo Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 844 days.

(21) Appl. No.: 12/071,847

(22) Filed: Feb. 27, 2008

(65) Prior Publication Data

US 2008/0203525 A1    Aug. 28, 2008

(30) Foreign Application Priority Data

Feb. 27, 2007   (KR) ................ 10-2007-0019878

(51) Int. Cl.
*H01L 23/62* (2006.01)
(52) U.S. Cl. ............... 257/529; 257/530; 257/E23.149; 257/E21.592; 257/209
(58) Field of Classification Search .......... 257/173, 257/516, 529, 530, 532, 665, 910, 401, 261, 257/268, 341, 348, 350, 368, 390, 391, 393, 257/402, 508, 907, E23.051
See application file for complete search history.

(56) References Cited

U.S. PATENT DOCUMENTS

| | | | | |
|---|---|---|---|---|
| 5,381,034 A * | 1/1995 | Thrower et al. | ............... | 257/529 |
| 5,450,030 A * | 9/1995 | Shin et al. | ...................... | 327/525 |
| 5,663,589 A * | 9/1997 | Saitoh et al. | .................. | 257/401 |
| 5,986,320 A * | 11/1999 | Kawano | ........................ | 257/529 |
| 6,496,053 B1* | 12/2002 | Daubenspeck et al. | ....... | 327/525 |
| 2001/0026182 A1* | 10/2001 | Brox | ............................ | 327/261 |
| 2004/0113826 A1* | 6/2004 | Whittaker et al. | ............ | 341/156 |
| 2004/0147087 A1 | 7/2004 | Cheng et al. | | |
| 2005/0041507 A1* | 2/2005 | Otsuka | ........................ | 365/225.7 |
| 2005/0139959 A1* | 6/2005 | Bernstein et al. | ............ | 257/595 |
| 2005/0247996 A1* | 11/2005 | Chung et al. | .................. | 257/529 |
| 2008/0237788 A1* | 10/2008 | Perkins | ........................ | 257/530 |

FOREIGN PATENT DOCUMENTS

JP   2001-308280   11/2001
KR   1020060075660   7/2006

* cited by examiner

*Primary Examiner* — Zandra Smith
*Assistant Examiner* — Tsz Chiu
(74) *Attorney, Agent, or Firm* — Harness, Dickey & Pierce, P.L.C.

(57) ABSTRACT

A capacitance trimming circuit of a semiconductor device may include a plurality of capacitor layers and/or a plurality of fuses. The plurality of capacitor layers may be vertically stacked. The plurality of fuses may be arranged to correspond to the plurality of capacitor layers, and/or the plurality of fuses may be configured to select corresponding ones of the plurality of capacitor layers for controlling a capacitance of the plurality of capacitor layers.

16 Claims, 4 Drawing Sheets

CAPACITANCE TRIMMING CIRCUIT OF SEMICONDUCTOR DEVICE HAVING VERTICALLY STACKED CAPACITOR LAYERS AND OPERATION METHOD THEREOF

PRIORITY STATEMENT

This application claims the benefit of priority to Korean Patent Application No. 10-2007-0019878, filed on Feb. 27, 2007, in the Korean Intellectual Property Office, the entire contents of which are incorporated herein in their entirety by reference.

BACKGROUND

1. Field

Example Embodiments relate to a capacitance trimming circuit of a semiconductor device and/or an operation method thereof, and for example, to a capacitance trimming circuit of a semiconductor device having vertically stacked capacitor layers and an operation method thereof.

2. Description of Related Art

An analog-to-digital converter (ADC) or a digital-to-analog converter (DAC) employs a capacitance trimming circuit in order to achieve capacitance matching or correct an RC time constant. A conventional capacitance trimming circuit includes a capacitor array unit including a plurality of capacitors which are arranged in an array and a switch control logic unit including a plurality of switches to control the capacitors of the capacitor array unit. The switches of the switch control logic unit are arranged to respectively correspond to the capacitors of the capacitor array unit. The conventional capacitance trimming circuit selects one of the capacitors arranged in the capacitor array unit according to a desired, or alternatively, a predetermined capacitance using the corresponding switch of the switch control logic unit.

In the conventional capacitance trimming circuit, metal-insulator-metal (MIM) capacitors or polysilicon-insulator-polysilicon (PIP) capacitors are used as the capacitors arranged in the capacitor array unit. A conventional MIM capacitor includes a lower metal electrode and an upper metal electrode, which are stacked on a semiconductor substrate, and an interlayer insulating layer interposed between the upper and lower metal electrodes. If the capacitor array unit includes the MIM capacitors, the MIM capacitors are formed using an additional mask process other than a process used for fabricating a semiconductor device, so that the entire process becomes more complicated. Because an additional MIM capacitor or PIP capacitor for redundancy is required, a chip size may increase. The conventional capacitance trimming circuit includes the switches that are arranged in an array to select one of the capacitors arranged in the capacitor array unit, so that the area of the capacitance trimming circuit may increase.

SUMMARY

Example embodiments provide a capacitance trimming circuit of a semiconductor device configured to trim a capacitance by selecting a desired, or alternatively, a predetermined number of vertically stacked capacitor layers depending on whether a fuse is cut. Accordingly, an area of the semiconductor device may be reduced and a trimming operation may be facilitated at an electrical die sorting (EDS) level or package level.

According to an example embodiment, a capacitance trimming circuit of a semiconductor device may include a plurality of capacitor layers and/or a plurality of fuses. The plurality of capacitor layers may be vertically stacked. The plurality of fuses may be arranged to correspond to the plurality of capacitor layers, and/or the plurality of fuses may be configured to select corresponding ones of the plurality of capacitor layers for controlling a capacitance of the plurality of capacitor layers.

According to an example embodiment, each of the plurality of capacitor layers may include a first capacitor electrode unit and/or a second capacitor electrode unit arranged in a horizontal direction. The first capacitor electrode unit may include a first body line extending in a first direction and/or a plurality of first electrode lines extending from a side of the first body line in a second direction. The second capacitor electrode unit may include a second body line extending in the first direction and/or a plurality of second electrode lines extending from a side of the second body line in the second direction. The plurality of first electrode lines and the plurality of second electrode lines may interdigitate. Each of the plurality of fuses may be connected to one of the first capacitor electrode unit and the second capacitor electrode unit of a corresponding one of the plurality of capacitor layers.

According to an example embodiment, the first body line and/or the plurality of first electrode lines of the first capacitor electrode unit may be metal lines, and/or the second body line and/or the plurality of second electrode lines of the second capacitor electrode unit may be metal lines.

According to an example embodiment, the capacitance trimming circuit of a semiconductor device may include a capacitor dielectric layer at least between the plurality of first electrode lines of the first capacitor electrode unit and the plurality of second electrode lines of the second capacitor electrode unit in each of the plurality of capacitor layers.

According to an example embodiment, the capacitance trimming circuit of a semiconductor device may include a plurality of insulating layers interposed between the plurality of capacitor layers. A portion of each of the plurality of insulating layers disposed between the plurality of first electrode lines of the first capacitor electrode unit and the plurality of second electrode lines of the second capacitor electrode unit in each of the plurality of capacitor layers may function as a capacitor dielectric layer.

According to an example embodiment, each of the plurality of insulating layers may include at least one via hole corresponding to one of the first body line of the first capacitor electrode unit and the second body line of the second capacitor electrode unit of each of the plurality of capacitor layers, and/or the plurality of capacitor layers may be electrically connected to one another through the via hole.

According to an example embodiment, the plurality of fuses may be electrical fuses.

According to an example embodiment, the plurality of capacitor layers may be sequentially stacked in a capacitor unit. The plurality of fuses may be included in a fuse array unit, the fuse array unit selecting ones of the plurality of capacitor layers depending on whether corresponding ones of the plurality of fuses are cut. The capacitance trimming circuit of a semiconductor device may include a determination unit, a control unit, and a fuse control unit. The determination unit may be configured to generate a capacitance trimming signal according to a capacitance of the capacitor unit. The control unit may be configured to receive the capacitance trimming signal to generate a control signal. The fuse control unit may be configured to output cutting signals for cutting the plurality of fuses of the fuse array unit in response to the control signal.

According to an example embodiment, each of the plurality of capacitor layers may include a plurality of first capacitor electrodes arranged in a horizontal direction and having a terminal connected in common; and/or a plurality of second capacitor electrodes alternating with the plurality of first capacitor electrodes in the horizontal direction and having a terminal connected in common. The terminals of the plurality of first capacitor electrodes that are connected in common may be disposed opposite the terminals of the plurality of second capacitor electrodes that are connected in common.

According to an example embodiment, the plurality of first capacitor electrodes and the plurality of second capacitor electrodes may be metal electrodes.

According to an example embodiment, the capacitance trimming circuit of a semiconductor device may include a capacitor dielectric layer disposed at least between the plurality of first capacitor electrodes and the plurality of second electrodes of each of the plurality of capacitor layers.

According to an example embodiment, the capacitance trimming circuit of a semiconductor device may include insulating layers interposed between the plurality of capacitor layers. A portion of each of the insulating layers disposed between the plurality of first capacitor electrodes and the plurality of second capacitor electrodes of each of the capacitor layers may function as a capacitor dielectric layer.

According to an example embodiment, the plurality of capacitor layers may have different capacitances.

According to an example embodiment, the plurality of capacitor layers may have the same capacitance.

According to an example embodiment a method of performing capacitance trimming may include selecting capacitor layers from among a plurality of vertically stacked capacitor layers using a plurality of fuses arranged to correspond to the plurality of vertically stacked capacitor layers to control a capacitance of the plurality of vertically stacked capacitor layers.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
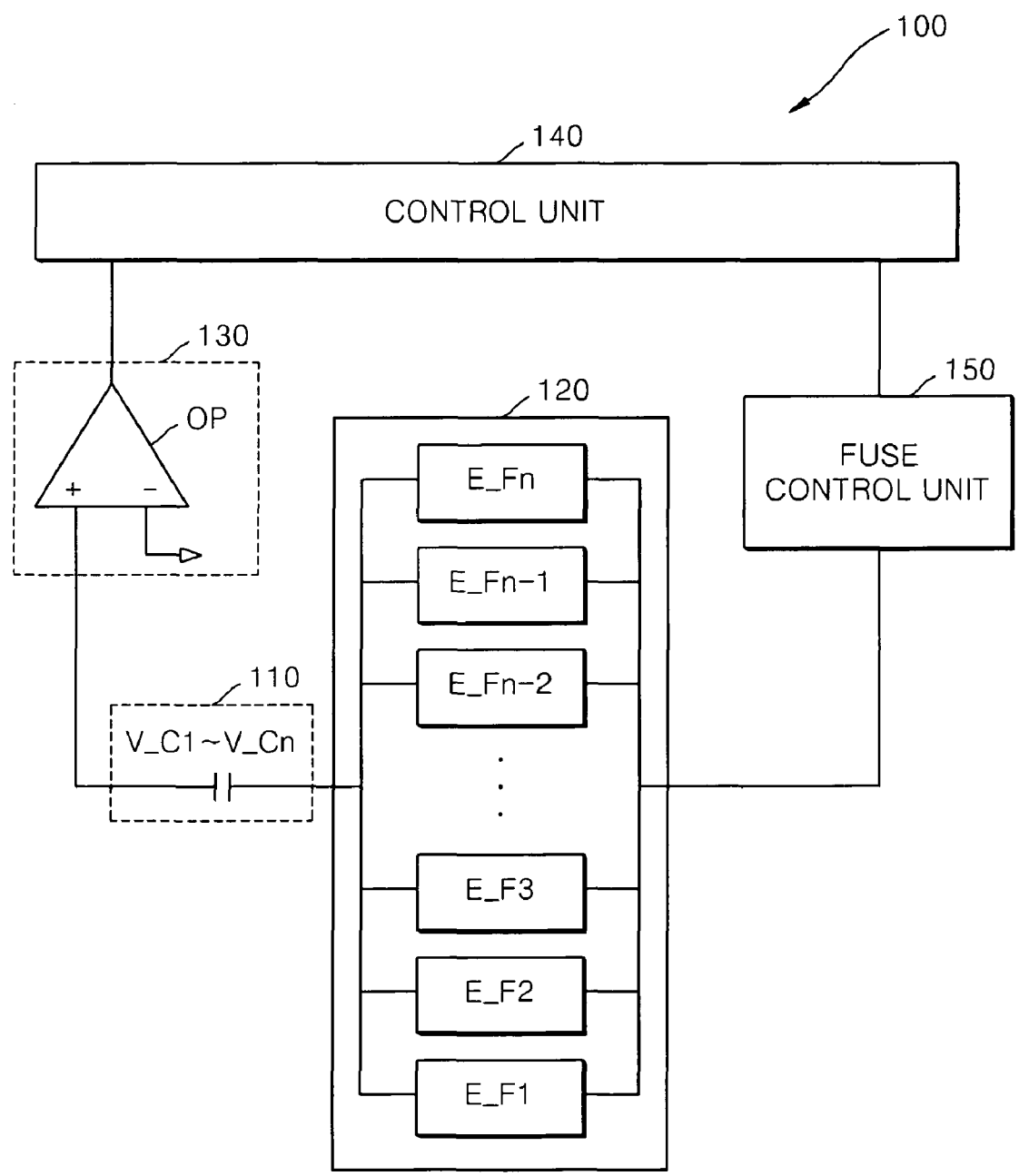
FIG. 1 is a construction diagram of a capacitance trimming circuit of a semiconductor device according to an example embodiment.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

FIG. 1 is a construction diagram of a capacitance trimming circuit 100 of a semiconductor device according to an example embodiment.

Referring to FIG. 1, the capacitance trimming circuit 100 may include a capacitor unit 110, a fuse array unit 120, a determination unit 130, a control unit 140, and/or a fuse control unit 150. The capacitor unit 110 may include a plurality of capacitor layers V_C1 to V_Cn, which are used to perform a capacitance trimming operation for correcting a time constant. The capacitor layers V_C1 to V_Cn may be vertically stacked. For example, the capacitor layers V_C1 to V_Cn may be sequentially stacked. The fuse array unit 120 may include a plurality of fuses E_F1 to E_Fn, which are arranged to respectively correspond to the capacitor layers V_C1 to V_Cn of the capacitor unit 110. Each of the fuses E_F1 to E_Fn may be an electrical fuse. Each of the electrical fuses E_F1 to E_Fn may select the corresponding one of the capacitor layers V_C1 to V_Cn to perform the capacitance trimming operation. The fuse array unit 120 may include a plurality of laser fuses instead of the electrical fuses E_F1 to E_Fn.

The determination unit 130 may generate a capacitance trimming signal according to a capacitance of the capacitor unit 110. The determination unit 130 may include an operational amplifier OP having a non-inverting terminal to which the capacitance of the capacitor unit 110 is provided. The inverting terminal of the operational amplifier may be connected to a ground. The control unit 140 may receive the capacitance trimming signal from the determination unit 130 and/or output a control signal for controlling the fuse control unit 150. The fuse control unit 150 may control the cutting of the fuses E_F1 to E_Fn of the fuse array unit 120 in response to the control signal output from the control unit 140.

If the capacitor unit 110 has a desired, or alternatively, a predetermined capacitance, the capacitor unit 110 may not require a capacitance trimming operation, and the determination unit 130 may apply the corresponding capacitance trimming signal to the control unit 140. The control unit 140 may apply the control signal for controlling the cutting of the fuses E_F1 to E_Fn to the fuse control unit 150 in response to the corresponding capacitance trimming signal. Accordingly, the fuse control unit 150 need not cut the fuses E_F1 to E_Fn of the fuse array unit 120.

If the capacitor unit 110 does not have a desired, or alternatively, a predetermined capacitance, the capacitor unit 110 may require a capacitance trimming operation, and the determination unit 130 may apply the corresponding capacitance trimming signal to the control unit 140. The control unit 140 may apply the control signal corresponding to the corresponding capacitance trimming signal to the fuse control unit 150. The fuse control unit 150 may output a cutting signal for cutting corresponding fuses of the fuses E_F1 to E_Fn in response to the control signal applied by the control unit 140.

Accordingly, the fuse control unit 140 may generate the cutting signal for cutting the corresponding fuses of the fuses E_F1 to E_Fn of the fuse array unit 120 according to the capacitance of the capacitor unit 110. As a result, the corresponding fuses of the fuses E_F1 to E_Fn may be cut in response to the cutting signal generated by the fuse control unit 150. For example, a number of the fuses E_F1 to E_Fn cut may be determined by trimmed capacitance. The capacitance of the capacitor unit 110 may be determined by the capacitor layers connected to the uncut fuses of the fuses E_F1 to E_Fn.

Figure 2:
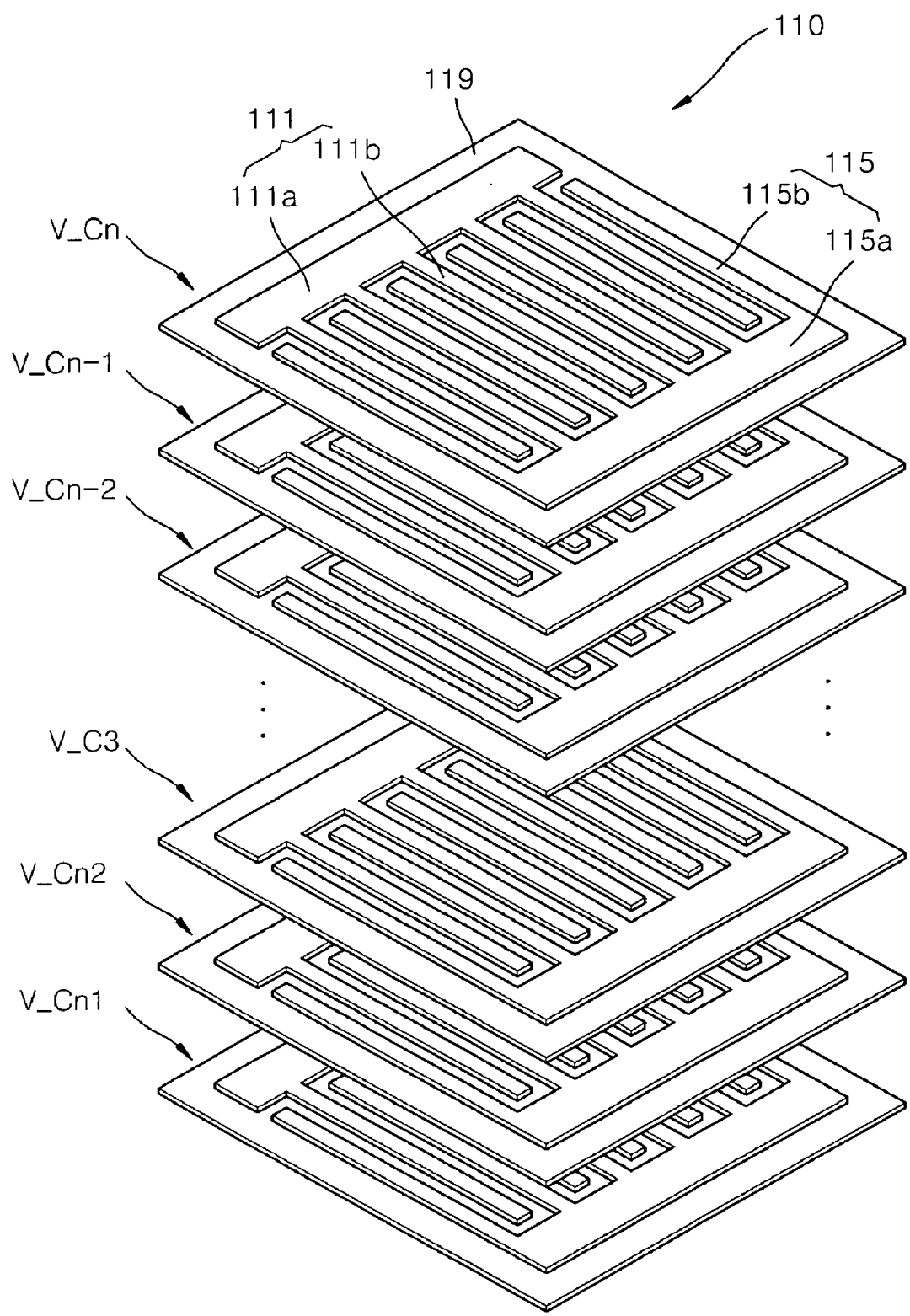
FIG. 2 is a perspective view of capacitor layers of a capacitor unit of the capacitance trimming circuit of the semiconductor device shown in FIG. 1.
Figure 3A:
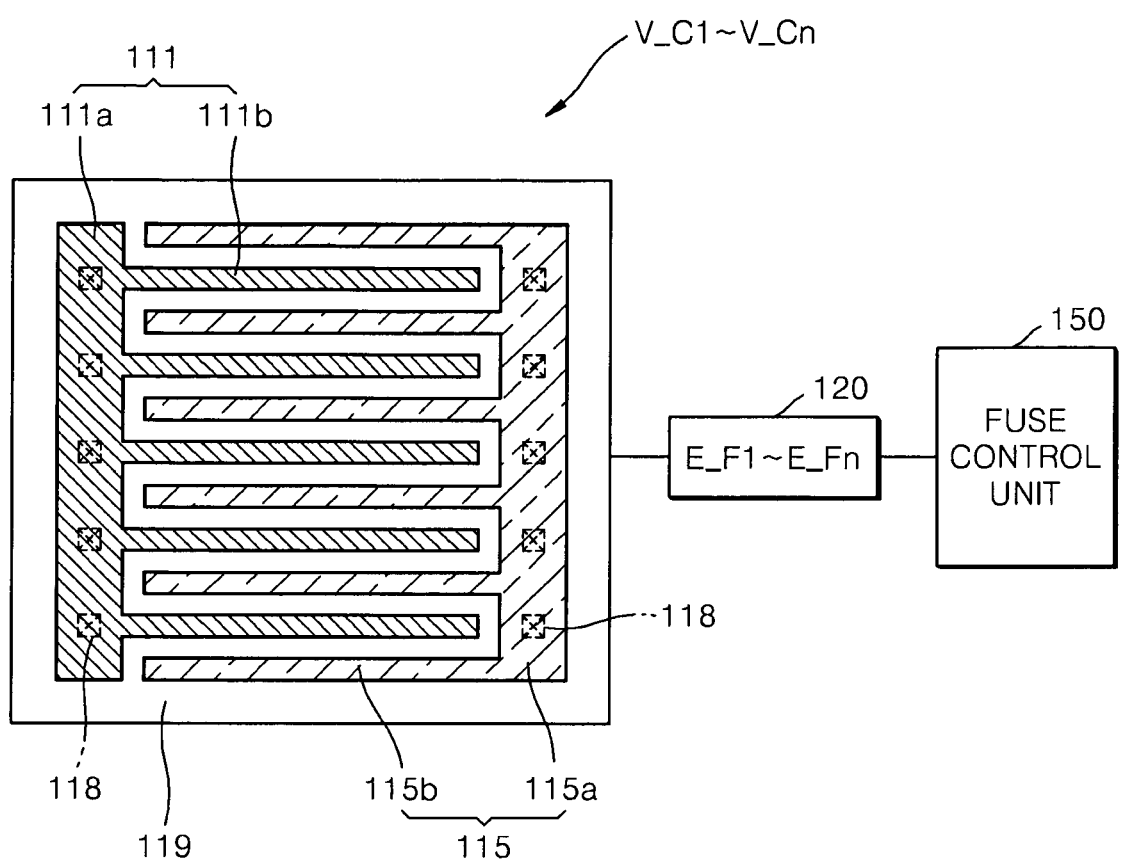
FIG. 3A is a plan view of the capacitor layers of the capacitor unit shown in FIG. 2.
Figure 3B:
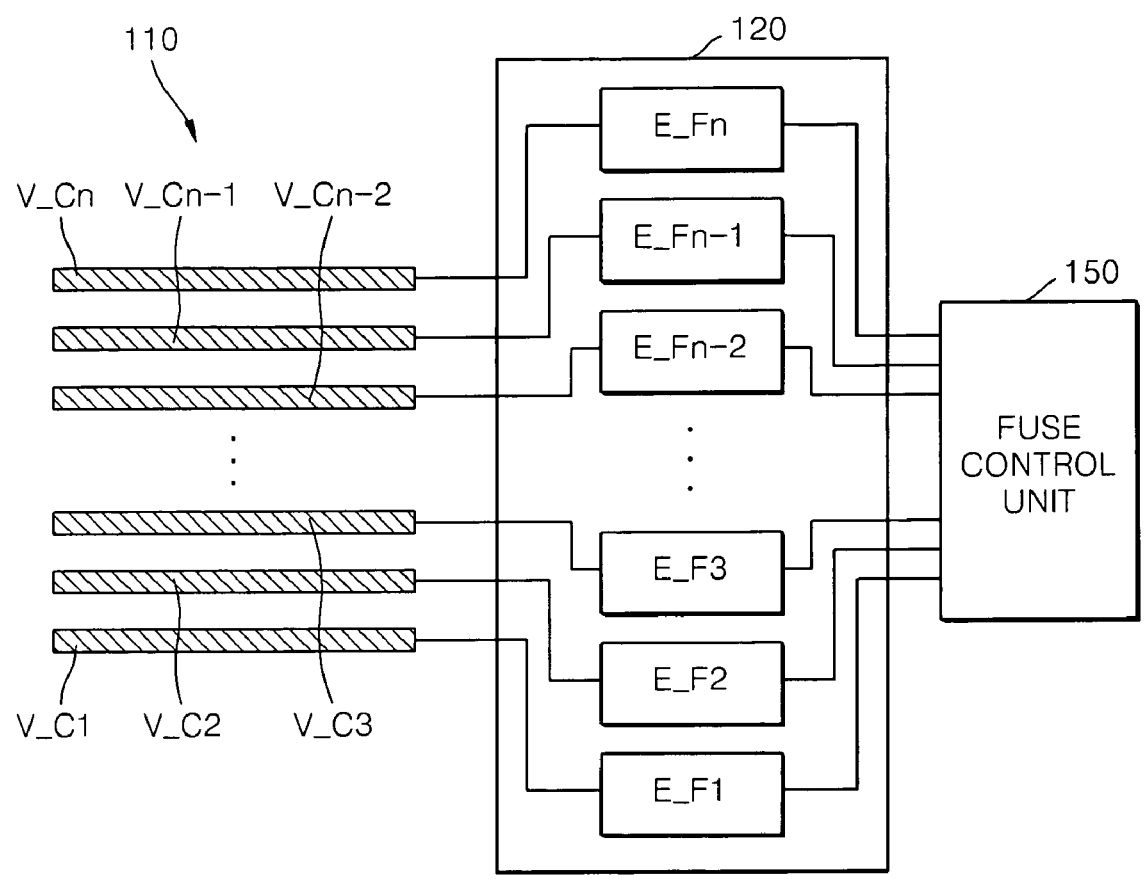
FIG. 3B is a cross-sectional view of the capacitor layers of the capacitor unit shown in FIG. 2.

FIG. 2 is a perspective view showing an example arrangement of the capacitor layers V_C1 to V_Cn of the capacitor unit 110 of the capacitance trimming circuit 100 of the semiconductor device shown in FIG. 1, FIG. 3A is a plan view of each of the capacitor layers V_C1 to V_Cn of the capacitor unit 110 shown in FIG. 2, and FIG. 3B is a cross-sectional view of electrode lines of the capacitor layers V_C1 to V_Cn illustrating an example arrangement of the capacitor layers V_C1 to V_Cn of the capacitor unit 110 shown in FIG. 2.

Referring to FIGS. 2, 3A, and 3B, the capacitor unit 110 may include the capacitor layers V_C1 to V_Cn that are vertically stacked. Each of the capacitor layers V_C1 to V_Cn may include a first capacitor electrode unit 111 and a second capacitor electrode unit 115. The first capacitor electrode unit 111 may include a first body line 111a and a plurality of first electrode lines 111b that extend from the first body line 111a. The second capacitor electrode unit 115 may include a second body line 115a and a plurality of second electrode lines 115b that extend from the second body line 115a. The first electrode lines 111b of the first capacitor electrode unit 111 may alternate with the second electrode lines 115b of the second capacitor electrode unit 115 so that each of the first electrode lines 111b and each of the second electrode lines 115b, which are horizontally disposed adjacent to each other, form a pair of capacitor electrodes. For example, the first electrode lines 111b and the second electrode lines 115b may interdigitate to form pairs of capacitor electrodes.

For example, the capacitor layers V_C1 to V_Cn may be stacked vertically and arranged on interlayer insulating layers 119, respectively. In each of the capacitor layers V_C1 to V_Cn, each of the first electrode lines 115b of the first capacitor electrode unit 111 and each of the second electrode lines 115b of the second capacitor electrode unit 115, which are disposed adjacent to each other on the same interlayer insulating layer 119, may form two electrodes of a capacitor.

The first body line 111a and the first electrode lines 111b of the first capacitor electrode unit 111 may be metal lines, and/or the second body line 115a and the second electrode lines 115b of the second capacitor electrode unit 115 may be metal lines.

The respective capacitor layers V_C1 to V_Cn may be formed during a fabrication process of the semiconductor device, and/or may not require an additional capacitor forming process. FIG. 2 illustrates that the interlayer insulating layers 119 may be separated from one another and/or the capacitor layers V_C1 to V_Cn may be disposed on the interlayer insulating layers 119, respectively. Accordingly, the capacitor layers V_C1 to V_Cn may be vertically stacked on the interlayer insulating layers 119, respectively, during the fabrication process of the semiconductor device. If the interlayer insulating layers 119 disposed on and under each of the capacitor layers V_C1 to V_Cn are referred to as an upper interlayer insulating layer and a lower interlayer insulating layer, respectively, the corresponding one of the capacitor layers V_C1 to V_Cn may be disposed on the lower interlayer insulating layer, and/or the upper interlayer insulating layer may be disposed on the capacitor layer and the lower interlayer insulating layer. Accordingly, a portion of the upper interlayer insulating layer interposed between the first and second electrode lines 111b and 115b of each of the capacitor layers V_C1 to V_Cn, which are disposed on the same lower interlayer insulating layer, may function as a capacitor dielectric layer. Alternatively, a capacitor dielectric layer may be disposed between the first and second electrode lines 111b and 115b of each of the capacitor layers V_C1 to V_Cn, which are disposed on the same lower interlayer insulating layer, and/or the upper interlayer insulating layer may be disposed thereon.

The number, width, and/or length of the first electrode lines 111b of each of the capacitor layers V_C1 to V_Cn, the number, width, and/or length of the second electrode lines 115b of each of the capacitor layers V_C1 to V_Cn, and/or an interval or gap between the first and second electrode lines 111b and 115b may depend on the capacitance of each of the capacitor layers V_C1 to V_Cn. The structures of the first and second capacitor electrode units 111 and 115 of the capacitor layers V_C1 to V_Cn may be variously changed, for example, the first and second capacitor electrode units 111 and 115 may have desired, or alternatively, predetermined structures. The capacitor layers V_C1 to V_Cn may have respectively different capacitances.

Referring to FIG. 3A, a plurality of via holes 118 may be disposed in a portion of the interlayer insulating layer 119 corresponding to the first body line 111a or the second body line 115a. Accordingly, the vertically stacked capacitor layers V_C1 to V_Cn may be electrically connected to one another through the via holes 118. The via holes 118 may be arranged to correspond to one of the first body line 111a of the first capacitor electrode unit 111 and the second body line 115a of the second capacitor electrode unit 115, which is not connected to the fuses E_F1 to E_Fn.

The corresponding ones of the fuses E_F1 to E_Fn of the fuse array unit 120 may be connected to the capacitor layers V_C1 to V_Cn. Each of the fuses E_F1 to E_Fn may be connected to one of the first and second electrode lines 111b and 115b of the capacitor layers V_C1 to V_Cn. A cutting signal may be applied from the fuse control unit 150 to the fuses E_F1 to E_Fn.

Similar to the capacitor layers V_C1 to V_Cn, the fuses E_F1 to E_Fn may be formed during the fabrication process of the semiconductor device. If the fuses E_F1 to E_Fn are electrical fuses, a process to form windows for irradiating laser beams may be omitted, and the entire process may be simplified and/or an area occupied by the fuses E_F1 to E_Fn may be reduced.

Accordingly, the capacitance trimming circuit of the semiconductor device according to an example embodiment may include vertically stacked capacitor layers so that an area occupied by capacitors may be reduced. Because the capacitor layers may be formed during a fabrication process of the semiconductor device, and the entire process may be simplified. The capacitances of the capacitors may be trimmed by cutting electrical fuses, and the area of the electrical fuses may be reduced. Similar to the capacitor layers, the electrical fuses may be formed during the fabrication process of the semiconductor device, thereby simplifying the entire process. A capacitance trimming operation may be performed at an electrical die sorting (EDS) and/or package level.

Although example embodiments have been shown and described in this specification and figures, it would be appreciated by those skilled in the art that changes may be made to the illustrated and/or described example embodiments without departing from their principles and spirit.

What is claimed is:

1. A capacitance trimming circuit of a semiconductor device, comprising:
   a capacitor unit including plurality of capacitor layers vertically stacked;
   a fuse array unit including a plurality of fuses each connected to corresponding ones of the plurality of capacitor layers;
   a fuse control unit configured to control a capacitance of the capacitor unit by selectively cutting one or more fuses from among the plurality of fuses included in the fuse array unit;
   a determination unit configured to generate a capacitance trimming signal according to a capacitance of the capacitor unit; and
   a control unit configured to receive the capacitance trimming signal to generate a control signal.

2. The circuit of claim 1, wherein
   each of the plurality of capacitor layers includes,
   a first capacitor electrode unit and a second capacitor electrode unit arranged in a horizontal direction,
   the first capacitor electrode unit including a first body line extending in a first direction and a plurality of first electrode lines extending from a side of the first body line in a second direction,
   the second capacitor electrode unit including a second body line extending in the first direction and a plurality of second electrode lines extending from a side of the second body line in the second direction,
   the plurality of first electrode lines and the plurality of second electrode lines interdigitating, and
   each of the plurality of fuses are connected to one of the first capacitor electrode unit and the second capacitor electrode unit of a corresponding one of the plurality of capacitor layers.

3. The circuit of claim 2, wherein
   the first body line and the plurality of first electrode lines of the first capacitor electrode unit are metal lines, and
   the second body line and the plurality of second electrode lines of the second capacitor electrode unit are metal lines.

4. The circuit of claim 2, further comprising:
   a capacitor dielectric layer at least between the plurality of first electrode lines of the first capacitor electrode unit and the plurality of second electrode lines of the second capacitor electrode unit in each of the plurality of capacitor layers.

5. The circuit of claim 2, further comprising:
   a plurality of insulating layers interposed between the plurality of capacitor layers,
   wherein a portion of each of the plurality of insulating layers disposed between the plurality of first electrode lines of the first capacitor electrode unit and the plurality of second electrode lines of the second capacitor electrode unit in each of the plurality of capacitor layers functions as a capacitor dielectric layer.

6. The circuit of claim 5, wherein
   each of the plurality of insulating layers includes at least one via hole corresponding to one of the first body line of the first capacitor electrode unit and the second body line of the second capacitor electrode unit of each of the plurality of capacitor layers, and
   the plurality of capacitor layers are electrically connected to one another through the via hole.

7. The circuit of claim 1, wherein the plurality of fuses are electrical fuses.

8. The circuit of claim 1, wherein
   the plurality of capacitor layers are sequentially stacked in a capacitor unit,
   wherein the fuse control unit is configured to output cutting signals for selectively cutting one or more fuses from among the plurality of fuses of the fuse array unit in response to the control signal.

9. The circuit of claim 8, wherein each of the plurality of capacitor layers includes,
   a plurality of first capacitor electrodes arranged in a horizontal direction and having a terminal connected in common; and
   a plurality of second capacitor electrodes alternating with the plurality of first capacitor electrodes in the horizontal direction and having a terminal connected in common,
   wherein the terminals of the plurality of first capacitor electrodes that are connected in common are disposed opposite the terminals of the plurality of second capacitor electrodes that are connected in common.

10. The circuit of claim 9, wherein the plurality of first capacitor electrodes and the plurality of second capacitor electrodes are metal electrodes.

11. The circuit of claim 10, further comprising:
a capacitor dielectric layer disposed at least between the plurality of first capacitor electrodes and the plurality of second electrodes of each of the plurality of capacitor layers.

12. The circuit of claim 10, further comprising:
insulating layers interposed between the plurality of capacitor layers,
wherein a portion of each of the insulating layers disposed between the plurality of first capacitor electrodes and the plurality of second capacitor electrodes of each of the capacitor layers functions as a capacitor dielectric layer.

13. The circuit of claim 1, wherein the plurality of capacitor layers have different capacitances.

14. The circuit of claim 1, wherein the plurality of capacitor layers have the same capacitance.

15. A capacitance trimming circuit of a semiconductor device, comprising:
a capacitor unit including plurality of capacitor layers vertically stacked;
a fuse array unit including a plurality of fuses each connected to corresponding ones of the plurality of capacitor layers;
a fuse control unit configured to control a capacitance of the capacitor unit by selectively cutting one or more fuses from among the plurality of fuses included in the fuse array unit;
a determination unit configured to generate a capacitance trimming signal according to a capacitance of the capacitor unit; and
a control unit configured to receive the capacitance trimming signal to generate a control signal,
wherein the fuse control unit is configured to output cutting signals for selectively cutting one or more fuses from among the plurality of fuses of the fuse array unit in response to the control signal.

16. The circuit of claim 15, wherein the control unit is configured to apply the control signal to the fuse control unit for cutting the fuses of the fuse array unit if the capacitor unit does not have a desired capacitance, while the control unit applies the control signal to the fuse control unit for preventing the fuse control unit from cutting the fuses of the fuse array unit if the capacitor unit has a desired capacitance.

* * * * *